United States Patent [19]

Lin et al.

[11] Patent Number: 5,858,591

[45] Date of Patent: Jan. 12, 1999

[54] OPTICAL PROXIMITY CORRECTION DURING WAFER PROCESSING THROUGH SUBFILE BIAS MODIFICATION WITH SUBSEQUENT SUBFILE MERGING

[75] Inventors: Chia Hui Lin; San-De Tzu; Chih-Chiang Tu, all of Hsin-Chu, Taiwan

[73] Assignee: Taiwan Semiconductor Manufacturing Company Ltd., Hsin-Chu, Taiwan

[21] Appl. No.: 17,407

[22] Filed: Feb. 2, 1998

[51] Int. Cl.$^6$ .................................. G03F 9/00; G03C 5/00
[52] U.S. Cl. .......................... 430/30; 430/296; 430/311; 430/325; 430/326
[58] Field of Search ............................. 430/30, 296, 311, 430/325, 326

[56] References Cited

U.S. PATENT DOCUMENTS

| | | | |
|---|---|---|---|
| 5,057,462 | 10/1991 | Eisenberg et al. | 437/229 |
| 5,375,157 | 12/1994 | Maehara | 378/35 |
| 5,432,714 | 7/1995 | Chung et al. | 364/525 |
| 5,498,579 | 3/1996 | Borodorsky et al. | 437/250 |
| 5,553,273 | 9/1996 | Liebmann | 395/500 |

*Primary Examiner*—Christopher G. Young
*Attorney, Agent, or Firm*—George O. Saile; Stephen B. Ackerman

[57] ABSTRACT

Improvement in the quality of photoresist images has been achieved. The data file in which the full description of the photoresist image, including Optical Proximity Corrections, has been stored is split into two subfiles. The split is made on the basis of separating cell descriptions (where the density of lines is high) from peripheral area descriptions (where lines tend to be isolated). A suitable bias in the form of a small increase or decrease (as appropriate) of all dimensions in the subfile is then applied. After the application of bias, the subfiles are merged back into a single data file and processing proceeds as usual.

15 Claims, 2 Drawing Sheets

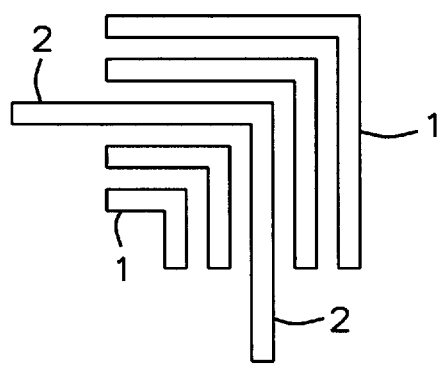
FIG. 1 – Prior Art
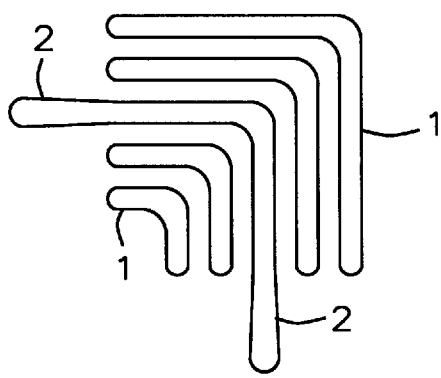
FIG. 2 – Prior Art
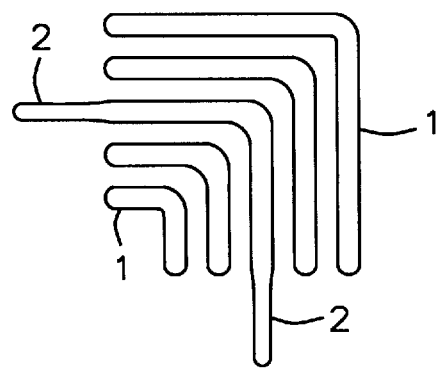
FIG. 3 – Prior Art

OPTICAL PROXIMITY CORRECTION DURING WAFER PROCESSING THROUGH SUBFILE BIAS MODIFICATION WITH SUBSEQUENT SUBFILE MERGING

BACKGROUND OF THE INVENTION (1) Field of the Invention

The invention relates to the general field of photolithography with particular reference to correction of image distortion.

(2) Description of the Prior Art

The proximity effect is a form of optical distortion associated with photoresist images. For a given development time, whether or not a given area of a photoresist layer will be left or removed after the development process depends on the total amount of energy deposited in that area during its exposure to radiation. Image features whose size and/or separation approach the resolution limit of said radiation will thus be subject to distortion that depends on how the diffraction maxima and minima, that lie on both sides of a 'sharp' edge, interact with one another.

The proximity effect can be compensated for, at least in part, by modifying any given feature in the opposite direction to the expected distortion. Thus, a line that would otherwise come out too narrow can be drawn as wider than its true width, etc. The data that represents the information from which a mask suitable for use in photolithography can be generated, is stored in a data file so corrections to allow for the proximity effect will also be stored there. The overall nature and scope of these corrections, and how they get into the file, will vary with the application and the user.

The optical proximity correction (OPC) is commonly calculated by summing two Gaussian functions whose value depend on a critical dimension (CD) defined by the design rules as well as on the wave-length of the exposing radiation. In general, the distortion of lines that are part of a dense assemblage will be more positive than the distortion of isolated lines in optical mode. There are, broadly speaking, three approaches that can be taken: (1) the CD for dense lines may be increased while the isolated lines are left unchanged (2) the CD for isolated lines may be decreased while the dense lines are left unchanged or (3) the CD for the dense lines may be increased while that of the isolated lines is simultaneously decreased.

Application of these various approaches is further complicated by the fact that results will additionally depend on the particular process that is being used. For example, some depth of focus (DOF) of isolated lines would be lost if the i-line process, involving exposing radiation with a wave-length of 365 nanometers (nm), is used whereas DOF will be enhanced in the Deep Ultraviolet (DUV) process which involves an exposing radiation wavelength of 248 nm.

In FIG. 1, we show an idealized line pattern made up of two main sections—a densely populated area 1 and an area 2 which contains only isolated lines. Line crowding as exemplified by 1 is typical of what is found in cell areas of an Integrated Circuit (IC) design whereas lone isolated lines such as 2 are typically found in the peripheral areas of ICs.

FIG. 2 shows how the pattern of FIG. 1 appears when transferred to photoresist on a plane wafer. The isolated or peripheral lines 2 can be seen to be slightly wider as well as slightly shorter than they were in the original mask (FIG. 1). In this case the photoresist image was produced using the i-line process. The image of FIG. 1 was subjected to OPC prior to its transfer to photoresist but, as seen, some distortion nevertheless remains.

FIG. 3 shows another example of how the pattern of FIG. 1 appears when transferred to photoresist on a topography wafer. In this case, the isolated or peripheral lines 2 can be seen to be slightly narrower or slightly wider as well as slightly shorter than they were in the original mask (FIG. 1). In this case the photoresist image was produced using the DUV process. The image of FIG. 1 was also subjected to OPC prior to its transfer to photoresist.

Various approaches have been taken in the prior art to dealing with the proximity effect. Eisenberg et al. (U.S. Pat. No. 5,057,462 October 1991) examine the results of a first pass attempt and then modify the etching and resist parameters accordingly. Borodovsky et al. (U.S. Pat. No. 5,498,579 March 1996) use two masks, the second one serving to compensate for proximity effects introduced by the first one. Liebmann (U.S. Pat. No. 5,553,273 September 1996) sorts a design into small areas according to shape and width and those areas that are identified as gate regions are biased based on applicable OPC rules. Maehara (U.S. Pat. No. 5,375,157 December 1994) teaches the manufacture of a distortion free mask for X-ray lithography. Chung et al. (U.S. Pat. No. 5,432,714 July 1995) show how accumulated information on exposure can be used during electron beam lithography to compensate for proximity effects. As will become clear, none of these methods offer the simplicity of application provided by the present invention.

SUMMARY OF THE INVENTION

It has been an object of the present invention to provide a process for transferring an optical pattern to photoresist with a minimum of distortion.

A further object of the present invention has been to obtain photoresist patterns having less distortion than is present in images that have been adjusted by means of an Optical Proximity Correction alone.

A still further object of the present invention has been to provide a process for removing distortion that remains in images even after an Optical Proximity Correction has been applied.

These object have been achieved by taking the GDS file in which the full description of the photoresist image, including Optical Proximity Corrections, has been stored and splitting it into two subfiles. The split is made on the basis of separating cell descriptions (where the density of lines is high) from peripheral area descriptions (where lines tend to be isolated). A suitable bias in the form of a small increase or decrease (as appropriate) of all dimensions in the subfile is then applied. After the application of bias, the subfiles are merged back into a single file and processing proceeds as usual.

BRIEF DESCRIPTION OF THE DRAWINGS

FIG. 1 is an idealized pattern for use in photoresist processing showing closely packed lines and isolated lines.

FIG. 2 shows the pattern of FIG. 1, after OPC, as transferred to photoresist by the i-line process.

FIG. 3 shows the pattern of FIG. 1, after OPC, as transferred to photoresist by the DUV process.

DESCRIPTION OF THE PREFERRED EMBODIMENTS

In most memory products, the mask patterns are very dense in cell areas but very sparse in peripheral areas. If both types of pattern are corrected at the same time, the dimensions in peripheral areas should be decreased with a corresponding decrease in the process window due to the DOF limitation of isolated lines. However, based on an integration viewpoint, there is little concern about the CD in peripheral areas (unless a broken line results). For the process that we will describe, CDs varied by about 10% around the values set by the design rules.

We have overcome this problem by splitting the data file into two separate files, one file for the cell area and one for the peripheral area, after the standard OPC has been applied to the full file. A small amount of experimentally determined bias is then applied to the data in each of the files. By 'bias' is meant increasing (for positive bias) all dimensions by a small amount. Similarly, negative bias implies a decrease in all dimensions. Such a correction, though very easy to apply to a data file, has proven to be very effective in fine tuning photoresist images and eliminating distortion that is still present even after OPC. This allows us to get good profile and CD control in the cell area and also enables us to improve the common DOF window for both cell and peripheral areas.

We will refer to the pattern shown in FIG. 1 as a way of simplifying the description of our process. The actual patterns to which our process will be applied will be substantially more complicated than FIG. 1. However, they will, in general, be made up of cell areas where many lines are packed into small areas (such as 1 in FIG. 1) and peripheral areas where most lines stand alone and are isolated (such as 2 in FIG. 1).

Figure 4:
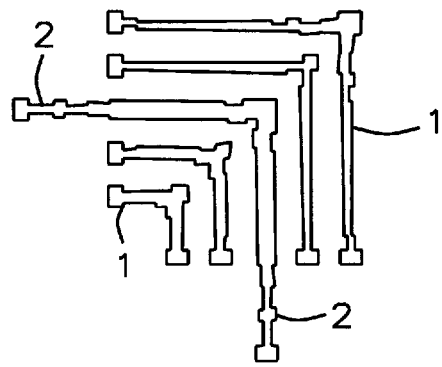
FIG. 4 shows the effect of OPC on the pattern of FIG. 1.

In order to prepare a suitable mask for transferring an image to photoresist, a description of the patterns is stored in a data file. This data file is then corrected for distortion that will be introduced by the Optical Proximity effect. The appearance of the pattern of FIG. 1 after the application of OPC is shown in FIG. 4.

The data file containing all the information needed to generate a photoresist mask is now split into two separate subfiles, one containing data relating to the cell areas (1 in FIG. 1) and one containing data relating to the peripheral areas (2 in FIG. 1). A small bias is now applied to the data in both files. The magnitude and sign of the bias applied to each subfile will depend on a number of process parameters such as the resist thickness, the wavelength of the radiation used, etc., as illustrated by the following examples.

EXAMPLE 1

Using a positive resist in the i-line process, the bias values were determined by experiment for both the cell areas and the peripheral areas. Specific bias values may be positive or negative and are a function of, inter alia, resist thickness and step height.

EXAMPLE 2

Using a positive resist in the DUV process, a different set of bias values were determined by experiment for both the cell areas and the peripheral areas. As before, specific bias values may be positive or negative and are a function of, inter alia, resist thickness and step height.

Application of the above improved data file begins with the coating of a substrate with a layer of the photoresist. A photoresist mask, generated from the merged file (as described above) is then used to expose the layer of photoresist to radiation, after which the exposed photoresist is developed to form a photoresist pattern.

Figure 5:
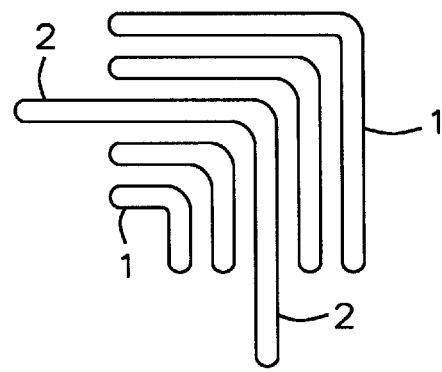
FIG. 5 shows the pattern of FIG. 1, after OPC followed by the selective application of a small bias as taught by the present invention, as transferred to photoresist by the DUV process.

The effect of using the biased subfile method that constitutes the present invention is illustrated in FIG. 5 which shows the resulting photoresist image. As in the preceding examples, the image of FIG. 5 originated as the pattern of FIG. 1 and the OPC corrected pattern of FIG. 4. However, the application of suitable bias to the subfiles has resulted in a relatively undistorted photoresist image. In particular, the isolated lines 2 (corresponding to the peripheral areas of a full chip design) are seen to have the same width in FIG. 5 as in FIG. 1.

While the invention has been particularly shown and described with reference to the preferred embodiments thereof, it will be understood by those skilled in the art that various changes in form and details may be made without departing from the spirit and scope of the invention.

What is claimed is:

1. A method for correcting the proximity effect in circuit patterns, comprising:

storing a description of a circuit pattern in a data file that comprises cell areas and peripheral areas;

modifying the data file by applying an Optical Proximity Correction to it;

dividing the corrected data file into first and second subfiles whereby the first subfile contains data relating to the cell areas and the second subfile contains data relating to the peripheral areas;

modifying the first subfile by applying a first bias to all data contained therein;

modifying the second subfile by applying a second bias to all data contained therein; and combining said first and second subfiles into a single merged data file.

2. The method of claim 1 wherein circuit patterns formed using the merged file have a critical dimension that is within about 10% of a value determined by design rules.

3. The method of claim 1 wherein radiation used to form circuit patterns from the merged file has a wavelength of 365 or 248 nm.

4. The method of claim 1 wherein the merged file is intended to be used with a positive photoresist.

5. The method of claim 1 wherein the merged file is intended to be used with a negative photoresist.

6. The method of claim 1 further comprising using the merged file during processing of integrated circuits.

7. The method of claim 1 wherein said first bias is determined by experiment.

8. The method of claim 1 wherein said second bias is determined by experiment.

9. A method for forming a photoresist pattern on a substrate, comprising:

coating the substrate with a layer of the photoresist;

storing a description of a photoresist image in a data file that comprises cell areas and peripheral areas;

modifying the data file by applying an Optical Proximity Correction to it;

dividing the corrected data file into first and second subfiles whereby the first subfile contains data relating to the cell areas and the second subfile contains data relating to the peripheral areas;

modifying the first subfile by applying a first bias to all data contained therein;

modifying the second subfile by applying a second bias to all data contained therein;

combining said first and second subfiles into a single merged data file;

forming a photoresist mask using the merged file;

exposing said layer of photoresist to radiation through the mask; and developing the exposed photoresist so as to form the pattern.

10. The method of claim 9 wherein the photoresist pattern has a critical dimension that is within about 10% of a value determined by design rules.

11. The method of claim 9 wherein radiation used to expose the photoresist layer has a wavelength of 365 or 248 nm.

12. The method of claim 9 wherein said first bias is determined by experiment.

13. The method of claim 9 wherein said second bias is determined by experiment.

14. The method of claim 9 wherein the resist is a positive photoresist.

15. The method of claim 9 wherein the resist is a negative photoresist.

* * * * *

UNITED STATES PATENT AND TRADEMARK OFFICE
CERTIFICATE OF CORRECTION

PATENT NO. : 5,858,591
DATED : 01/12/99
INVENTOR(S) : Chia Hui Lin, San-De Tzu, and Chih-Chiang Tu It is certified that error appears in the above-identified patent and that said Letters Patent is hereby corrected as shown below:

On the Cover Page, item [75]

Chia Hui Lin; San-De Tzu; Chih-Chiang Tu, all of Hsin-Chu, Taiwan and replace with;

Chia Hui Lin, Hsin-Chu; San-De Tzu, Taipei; Chih-Chiang Tu, Tauyen, all of Taiwan.

Signed and Sealed this

Twenty-seventh Day of July, 1999

Attest:

Q. TODD DICKINSON

*Attesting Officer*      *Acting Commissioner of Patents and Trademarks*